United States Patent
Nakada

(10) Patent No.: US 11,056,639 B2
(45) Date of Patent: Jul. 6, 2021

(54) MAGNETORESISTANCE EFFECT ELEMENT

(71) Applicant: TDK CORPORATION, Tokyo (JP)

(72) Inventor: Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/412,727

(22) Filed: May 15, 2019

(65) Prior Publication Data

US 2019/0355898 A1    Nov. 21, 2019

(30) Foreign Application Priority Data

May 16, 2018 (JP) .............................. JP2018-094448

(51) Int. Cl.
*H01L 43/02* (2006.01)
*H01L 43/12* (2006.01)
*H01L 43/10* (2006.01)

(52) U.S. Cl.
CPC .............. *H01L 43/02* (2013.01); *H01L 43/10* (2013.01); *H01L 43/12* (2013.01)

(58) Field of Classification Search
CPC .......... H01L 43/02; H01L 43/10; H01L 43/12
USPC .......................................................... 257/421
See application file for complete search history.

(56) References Cited

U.S. PATENT DOCUMENTS

| | | | | |
|---|---|---|---|---|
| 4,002,592 | A * | 1/1977 | Baskin | C08K 7/00 523/153 |
| 6,219,274 | B1 * | 4/2001 | Shimazawa | B82Y 10/00 257/E43.004 |
| 2009/0097168 | A1 * | 4/2009 | Inomata | B82Y 10/00 360/324.1 |
| 2012/0091548 | A1 * | 4/2012 | Sukegawa | G11B 5/3909 257/421 |
| 2013/0003579 | A1 | 1/2013 | Lu et al. | |
| 2013/0221461 | A1 | 8/2013 | Sukegawa et al. | |
| 2015/0179925 | A1 * | 6/2015 | Tahmasebi | H01L 27/222 257/421 |
| 2017/0170392 | A1 * | 6/2017 | Sasaki | G01R 33/098 |

FOREIGN PATENT DOCUMENTS

| | | |
|---|---|---|
| JP | 2013-175615 A | 9/2013 |
| JP | 5586028 B2 | 9/2014 |
| JP | 5588019 B2 | 9/2014 |

OTHER PUBLICATIONS

Scheike, Thomas et al. "Lattice-matched magnetic tunnel junctions using a Heusler alloy Co2FeAl and a cation-disorder spinel Mg—Al—O barrier". Applied Physics Letters, vol. 105, pp. 242407, 2014.

Miura, Yoshio et al. "First-principles study of tunneling magnetoresistance in Fe/MgAl2O4/Fe(001) magnetic tunnel junctions". Physical Review B, vol. 86, pp. 024426, 2012.

Sukegawa, Hiroaki et al. "Tunnel magnetoresistance with improved bias voltage dependence in lattice-matched Fe/spinel MgAl2O4/Fe(001) junctions". Applied Physics Letters, vol. 96, pp. 212505, 2010.

* cited by examiner

*Primary Examiner* — Dzung Tran
(74) *Attorney, Agent, or Firm* — Oliff PLC

(57) ABSTRACT

A magnetoresistance effect element includes: a first ferromagnetic layer; a second ferromagnetic layer; and a tunnel barrier layer sandwiched between the first ferromagnetic layer and the second ferromagnetic layer, wherein the tunnel barrier layer is an oxide having a spinel structure, and the tunnel barrier layer includes a magnetic element as an additional element.

11 Claims, 5 Drawing Sheets

MAGNETORESISTANCE EFFECT ELEMENT

CROSS-REFERENCE TO RELATED APPLICATION

Priority is claimed on Japanese Patent Application No. 2018-094448, filed May 16, 2018, the content of which is incorporated herein by reference.

BACKGROUND OF THE INVENTION

Field of the Invention

The present invention relates to a magnetoresistance effect element.

Description of Related Art

A giant magnetoresistance (GMR) element including a multilayer film including a ferromagnetic layer and a nonmagnetic layer and a tunneling magnetoresistance (TMR) element using an insulating layer (a tunnel barrier layer, a barrier layer) in a nonmagnetic layer are known. In general, a TMR element has higher element resistance and has a higher magnetoresistance (MR) ratio than a GMR element. A TMR element is attracting attention as an element for a magnetic sensor, a high-frequency component, a magnetic head and a nonvolatile random-access memory (MRAM).

TMR elements can be classified into two types according to differences in tunnel conduction mechanism of electrons. One is TMR elements using only a penetration effect (a tunneling effect) of a wave function between the ferromagnetic layers. The other is TMR elements dominated by coherent tunneling (in which only electrons having the symmetry of a specific wave function tunnel) which uses conduction of a specific orbit of a nonmagnetic insulating layer tunneling when the tunnel effect occurs. It is known that a TMR element in which a coherent tunnel is dominant can obtain a larger MR ratio as compared with a TMR element using only a tunneling effect.

Regarding a tunnel barrier layer capable of obtaining a coherent tunneling effect, MgO therefor is widely known. Further, research on materials able to substitute MgO is in progress. For example, $MgAl_2O_4$ having a spinel structure as an alternative to MgO is disclosed in Patent Document 1.

Patent Document 2 discloses that a disordered spinel structure can obtain a large MR ratio when a case of using a spinel structure for the tunnel barrier layer (Patent Document 1) and a case of using a disordered spinel structure for the tunnel barrier layer (Patent Document 2) are compared with each other.

CITATION LIST

Patent Documents

[Patent Document 1] Japanese Patent No. 5586028
[Patent Document 2] Japanese Unexamined Patent Application, First Publication No. 2013-175615

SUMMARY OF THE INVENTION

It is expected that these magnetoresistance effect elements will be able to be used in various applications. When considering practical use thereof, magnetoresistance effect elements are used in various temperature ranges. For example, in the case of an in-vehicle device, guaranteed operation in a wide temperature range of −40° C. to 150° C. may be required. A magnetoresistance effect element which operates stably is required also when a temperature range during use thereof varies.

The present invention has been realized in view of the above-described circumstances, and an object of the present invention is to provide a magnetoresistance effect element with little fluctuation in an MR ratio in accordance with temperature variation.

SOLUTION TO PROBLEM

As a result of intensive investigations, the inventors have found that magnon scattering can be minimized and the temperature dependence of the MR ratio of the magnetoresistance effect element can be minimized by adding a magnetic element to a material constituting a tunnel barrier layer, thus increasing the magnetic stiffness of the magnetization in the vicinity of an interface between a ferromagnetic layer and the tunnel barrier layer.

That is, the present invention provides the following means to solve the above-described problem.

(1) According to a first aspect, a magnetoresistance effect element includes a first ferromagnetic layer, a second ferromagnetic layer, and a tunnel barrier layer sandwiched between the first ferromagnetic layer and the second ferromagnetic layer, wherein the tunnel barrier layer is an oxide having a spinel structure, and the tunnel barrier layer includes a magnetic element as an additional element.

(2) In the magnetoresistance effect element according to an aspect, the magnetic element may be one or more elements selected from a group consisting of Cr, Mn, Fe, Co, and Ni.

(3) In the magnetoresistance effect element according to the aspect, the magnetic element may be one or more elements selected from a group consisting of Fe, Co, and Ni.

(4) In the magnetoresistance effect element according to the aspect, more of the magnetic element may be present on interface sides between the tunnel barrier layer and the first ferromagnetic layer and the second ferromagnetic layer than at a center of the tunnel barrier layer in a laminating direction.

(5) In the magnetoresistance effect element according to the aspect, the tunnel barrier layer may be an oxide having a spinel structure including an element A and an element B, the element A may be one or more elements selected from a group consisting of Mg and Zn, and the element B may be one or more elements selected from a group consisting of Al, In, and Ga.

(6) In the magnetoresistance effect element according to the aspect, an abundance ratio of the magnetic element with respect to the total number of atoms of the element A and the element B in the tunnel barrier layer may be 0.3 at % or more and 3 at % or less.

(7) In the magnetoresistance effect element according to the aspect, the tunnel barrier layer may be represented by a composition formula $A_\alpha B_\beta M_x O_y$, and in the composition formula, A may be the element A, B may be the element B, M may be a magnetic element, and $\alpha+\beta+x=1$, $\beta \neq 0$, $0.35 \leq y \leq 1.7$, $0.003 \leq x \leq 0.029$.

(8) In the magnetoresistance effect element according to the aspect, an MR ratio at room temperature may be 80% or more.

(9) In the magnetoresistance effect element according to the aspect, a ratio of the MR ratio at a temperature of 400 K to the MR ratio at room temperature may be 0.9 or more.

According to the present invention, it is possible to provide a magnetoresistance effect element with little fluctuation in an MR ratio in accordance with temperature variation.

DETAILED DESCRIPTION OF THE INVENTION

Figure 1:
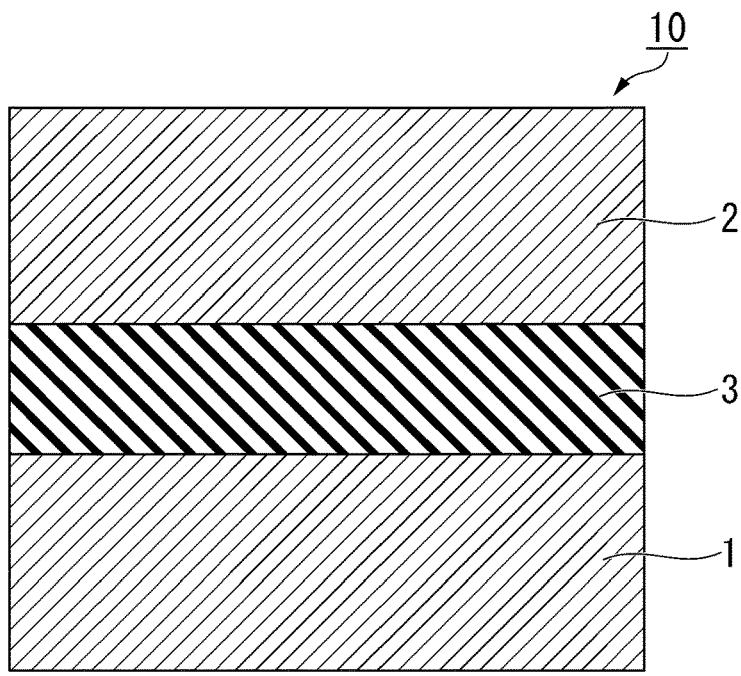
FIG. 1 is a schematic cross-sectional view of a magnetoresistance effect element according to an embodiment.

Hereinafter, the present invention will be described in detail with reference to the drawings as appropriate. In the drawings used in the following description, for the sake of clarity of the features of the present invention, characteristic portions may be enlarged for convenience, and dimensional ratios between respective components may be different from actual ones. Materials, dimensions, and the like exemplified in the following description are only examples, and the present invention is not limited thereto, and can be realized with appropriate modifications within a scope not departing from the gist thereof.

"Magnetoresistance Effect Element"

FIG. 1 is a schematic cross-sectional view of a magnetoresistance effect element according to an embodiment. The magnetoresistance effect element 10 shown in FIG. 1 includes a first ferromagnetic layer 1, a second ferromagnetic layer 2, and a tunnel barrier layer 3. Also, the magnetoresistance effect element 10 may have a cap layer, an underlayer, and the like, in addition to these layers.

(First Ferromagnetic Layer and Second Ferromagnetic Layer)

The first ferromagnetic layer 1 and the second ferromagnetic layer 2 have magnetization. The magnetoresistance effect element 10 outputs a relative angle change of the magnetization as a change in a resistance value. For example, when a magnetization direction of the second ferromagnetic layer 2 is fixed and a magnetization direction of the first ferromagnetic layer 1 is variable with respect to the magnetization direction of the second ferromagnetic layer 2, the resistance value of the magnetoresistance effect element 10 changes as the magnetization direction of the first ferromagnetic layer 1 changes. A layer of which the magnetization direction is fixed is generally referred to as a fixed layer, and a layer of which the magnetization direction is variable is generally referred to as a free layer. Since a change in the resistance value occurs in accordance with a change in the relative angle of the magnetization, both the magnetization of the first ferromagnetic layer 1 and the magnetization of the second ferromagnetic layer 2 may not be fixed.

The first ferromagnetic layer 1 and the second ferromagnetic layer 2 include a ferromagnetic material. For example, a metal selected from the group consisting of Cr, Mn, Co, Fe, and Ni, an alloy including one or more metals selected from this group, and an alloy including one or more metals selected from this group and one or more elements of B, C, and N may be used as a ferromagnetic material. In particular, since an Fe or CoFe alloy has a high spin polarization, an MR ratio of the magnetoresistance effect element 10 can be increased when an Fe or CoFe alloy is used for the first ferromagnetic layer 1 or the second ferromagnetic layer 2. Specific examples for the first ferromagnetic layer 1 and the second ferromagnetic layer 2 may include Co—Fe, Co—Fe—B, Ni—Fe, a Co—Ho alloy ($CoHo_2$), a Sm—Fe alloy ($SmFe_{12}$), and the like.

The first ferromagnetic layer 1 and the second ferromagnetic layer 2 may be Heusler alloys such as $Co_2FeSi$. A Heusler alloy has a high spin polarization and can realize a high MR ratio. A Heusler alloy includes an intermetallic compound having a chemical composition of XYZ or $X_2YZ$. X represents a Co-, Fe-, Ni-, or Cu-group transition metal element or a noble metal element in the periodic table. Y represents a Mn-, V-, Cr-, or Ti-group transition metal and can also represent the elements represented by X. Z is a typical element of group III to group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be used. A Heusler alloy has a high spin polarization and can increase the MR ratio of the magnetoresistance effect element 10.

When the magnetization directions of the first ferromagnetic layer 1 and the second ferromagnetic layer 2 are set to be perpendicular to a lamination surface using interface perpendicular magnetic anisotropy, it is preferable that film thicknesses of the first ferromagnetic layer 1 and the second ferromagnetic layer 2 be 3 nm or less. The interface perpendicular magnetic anisotropy is imparted to the first ferromagnetic layer 1 and the second ferromagnetic layer 2 at interfaces between the first ferromagnetic layer 1 and the second ferromagnetic layer 2 and the tunnel barrier layer 3. Since there is an effect of the interfacial perpendicular magnetic anisotropy becoming relatively attenuated as the film thicknesses of the first ferromagnetic layer 1 and the second ferromagnetic layer 2 increase, the film thicknesses of the first ferromagnetic layer 1 and the second ferromagnetic layer 2 are preferably thin.

When the first ferromagnetic layer 1 is a fixed layer and the second ferromagnetic layer 2 is a free layer, a coercivity of the first ferromagnetic layer 1 is higher than a coercivity of the second ferromagnetic layer 2. A coercivity difference can be adjusted using a material constituting the ferromagnetic layer, a layer adjacent to the ferromagnetic layer, or the like. For example, a material having a coercivity higher than that of the material forming the second ferromagnetic layer 2 may be used for the first ferromagnetic layer 1, and an antiferromagnetic material such as IrMn, PtMn and the like may be adjacent to the first ferromagnetic layer 1. Also, in order to prevent a leakage magnetic field of the first ferromagnetic layer 1 from affecting the second ferromagnetic layer 2, the first ferromagnetic layer may have a synthetic ferromagnetic coupling structure.

(Tunnel Barrier Layer)

The tunnel barrier layer 3 is an oxide having a spinel structure. Also, the tunnel barrier layer 3 includes a magnetic element as an additional element. The magnetic element is an element which allows ferromagnetism or antiferromagnetism to develop due to being included in an alloy or an intermetallic compound. A 3d transition element such as Fe, Co, Ni, Gd, Tb, Dy or the like or a rare earth element are examples of an element which develops ferromagnetism, and a 3d transition element such as Cr, Mn, Nd, Sm, Eu or the like or a rare earth element are examples of an element which develops antiferromagnetism. The tunnel barrier layer 3 may include a magnetic element but is a nonmagnetic oxide film in principle. The expression "nonmagnetic in principle" means that it does not have enough magnetism to exert a strong influence on the overall characteristics (for example, the MR ratio) of the magnetoresistance effect element 10.

The spinel structure that can be selected for the tunnel barrier layer 3 is not limited to an ordered spinel structure and also includes a disordered spinel structure.

Figure 2:
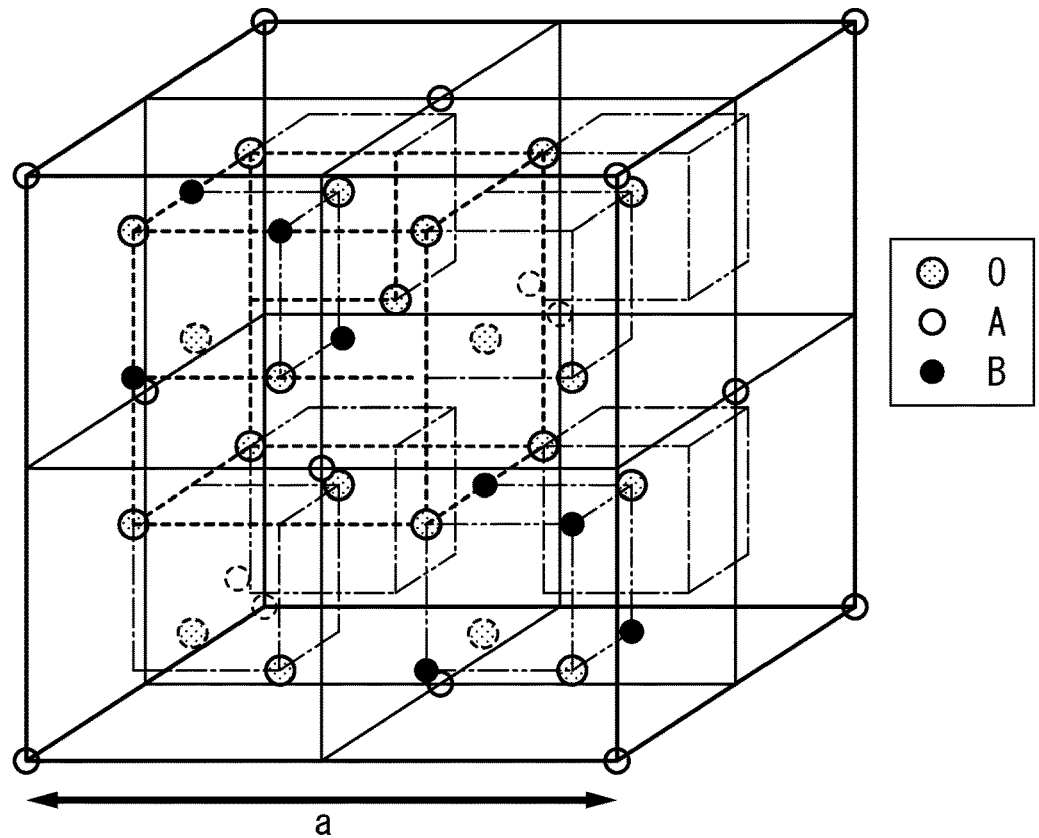
FIG. 2 is a view showing a crystal structure of a spinel structure.

FIG. 2 is a diagram schematically showing a crystal structure of an ordered spinel structure. As shown in FIG. 2, in an ordered spinel structure, sites at which an element A is accommodated and sites at which an element B is accommodated are fixed, and an arrangement of these elements is regular.

Here, the element A is one or more elements selected from the group consisting of Mg and Zn, and the element B is one or more elements selected from the group consisting of Al, In, and Ga. It is preferable to use Mg as the element A and Al as the element B.

Figure 3:
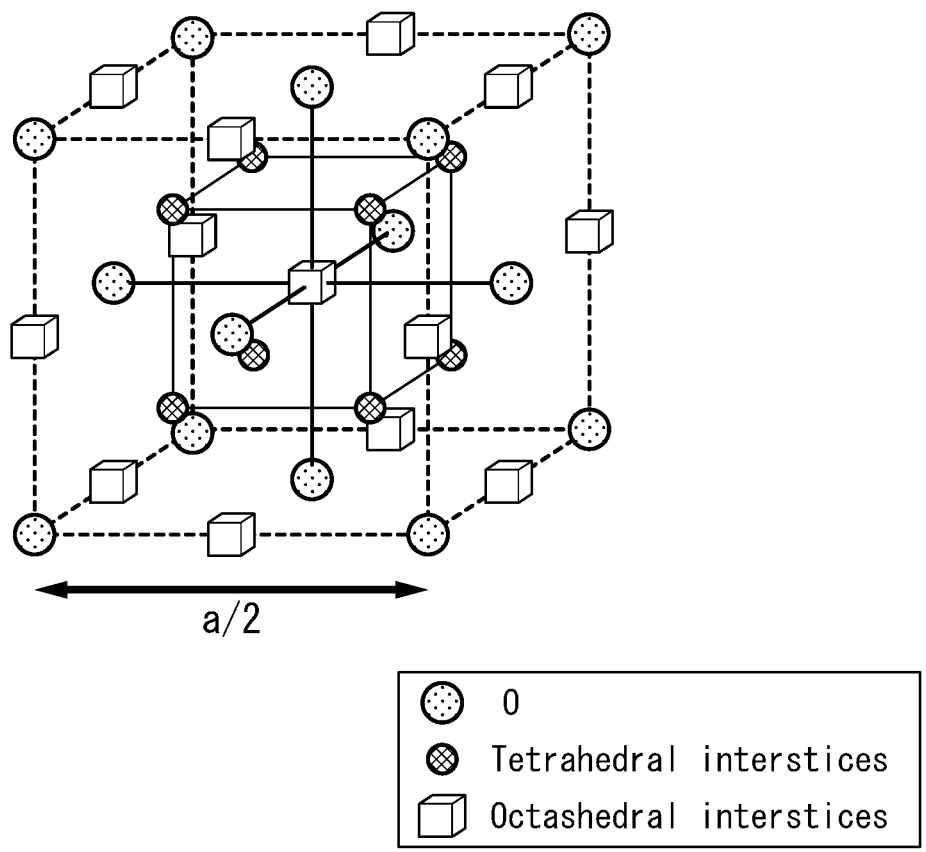
FIG. 3 is a view showing a crystal structure of a disordered spinel structure.

On the other hand, FIG. 3 is a view schematically showing the crystal structure of a disordered spinel structure. In the case of the disordered spinel structure, the element A or the element B can be present at any one of a site tetrahedrally coordinated with respect to oxygen shown in FIG. 3 and a site octahedrally coordinated with respect to the oxygen. The elements A and B randomly enter any of these sites. When the element A and the element B having different atomic radii enter these sites randomly, the crystal structure becomes irregular. A lattice constant (a/2) of the disordered spinel structure is approximately half of a lattice constant (a) of the ordered spinel structure.

An oxide with a spinel structure including A and B is expressed as A-B-O. Since a ratio of Mg to Al is not determined, it is often written as described above without using subscripts. In the case of the ordered spinel structure, the ratio of A to B is 1:2 and is expressed as $AB_2O_4$ regarding a stoichiometric composition. For example, when the element A is Mg and the element B is Al, it is expressed as $MgAl_2O_4$. A composition in an actually laminated tunnel barrier layer 3 allows deviation from a stoichiometric composition.

Further, the tunnel barrier layer 3 includes a magnetic element as an additional element. The additional element is not present separately but is present in the crystal structure. The additional element may substitute a part of the crystal structure constituting the tunnel barrier layer 3 or may intrude into a crystal lattice constituting the crystal structure. The former is called a substitutional solid solution, and the latter is called an interstitial solid solution.

Figures 4A, 4B:
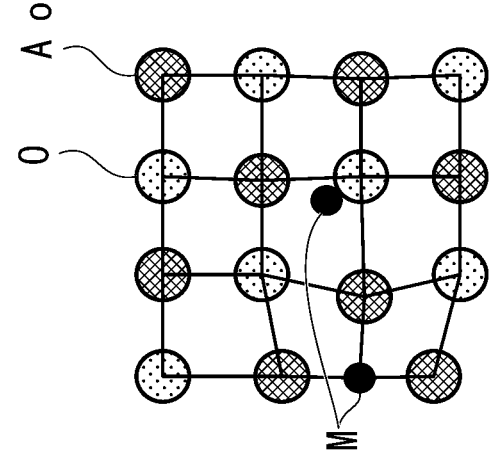
FIGS. 4A to 4C are views of a crystal lattice of a tunnel barrier layer in the magnetoresistance effect element according to the embodiment when seen in one direction.
Figure 4C:
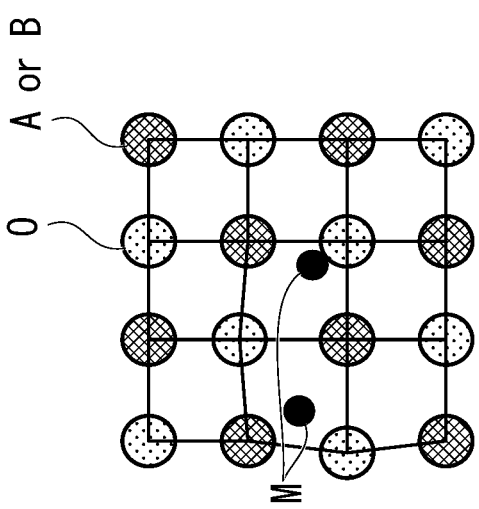

FIGS. 4A to 4C are views of the crystal lattice of the tunnel barrier layer 3 when seen in one direction. FIG. 4A shows an example of the interstitial solid solution in which a magnetic element M intrudes between the crystal lattices. FIG. 4C shows an example of the substitutional solid solution in which the magnetic element M substitutes a part of the element constituting the crystal lattice. FIG. 4B is an example in which an interstitial solid solution and a substitutional solid solution in which a part of the magnetic element M intrudes between the crystal lattices and another part of the magnetic element M substitutes an element constituting the crystal lattice are mixed. Distortion of the crystal lattice of the tunnel barrier layer 3 tends to be larger in the substitutional solid solution than in the interstitial solid solution. Therefore, a degree of distortion of the crystal lattice tends to increase in the order of FIG. 4A, FIG. 4B, and FIG. 4C. When the distortion of the crystal structure is larger, it is more likely to have the disordered spinel structure.

When the magnetic element is added to the tunnel barrier layer 3, temperature dependency of the magnetoresistance effect element 10 becomes low. Hereinafter, the reason for this will be described below.

The temperature dependency of the magnetoresistance effect element 10 is affected by the stability of the magnetization of the first ferromagnetic layer 1 and the second ferromagnetic layer 2. When the stability of the magnetization of the first ferromagnetic layer 1 and the second ferromagnetic layer 2 is low, the magnetizations of the first ferromagnetic layer 1 and the second ferromagnetic layer 2 easily fluctuate. When a difference between a fluctuation amount of the magnetization of the first ferromagnetic layer 1 and the second ferromagnetic layer 2 at a high temperature and a fluctuation amount of the magnetization of the first ferromagnetic layer 1 and the second ferromagnetic layer 2 at a low temperature is large, the temperature dependency of the MR ratio of the magnetoresistance effect element 10 increases.

Figure 5:
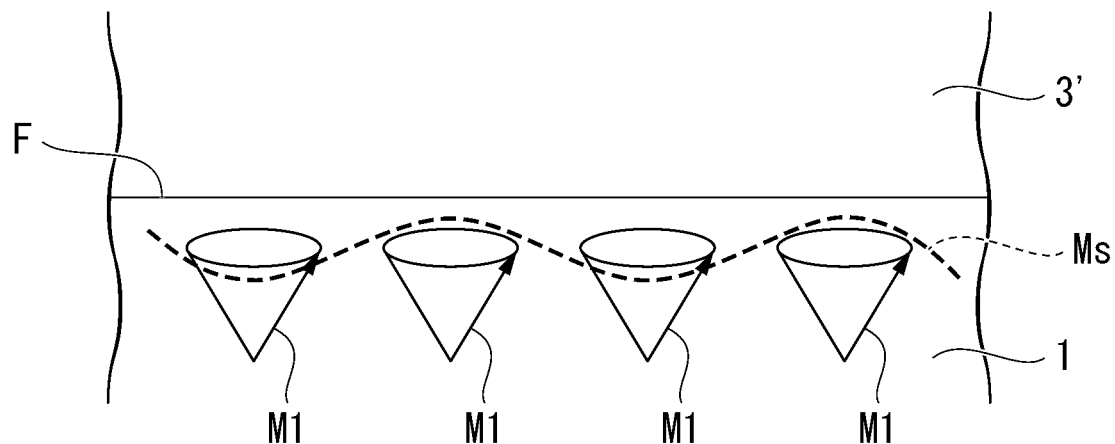
FIG. 5 is an image diagram schematically showing a magnetization state at an interface between a tunnel barrier layer and a first ferromagnetic layer when a magnetic element is not added to the tunnel barrier layer.
Figure 6:
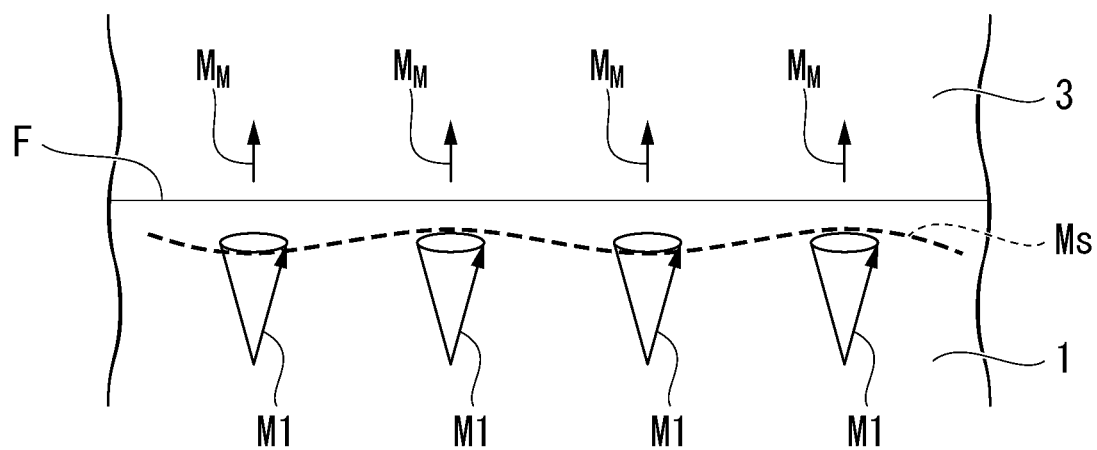
FIG. 6 is an image diagram schematically showing a magnetization state at the interface between the tunnel barrier layer and the first ferromagnetic layer when a magnetic element is added to the tunnel barrier layer.

FIGS. 5 and 6 are image diagrams explaining the difference in the stability of the magnetization of the ferromagnetic layer in accordance with the presence or absence of the magnetic element. FIGS. 5 and 6 show a vicinity of an interface F between the first ferromagnetic layer 1 and the tunnel barrier layers 3 and 3' as a representative portion. FIG. 5 shows an example in a case in which a magnetic element is not added to the tunnel barrier layer 3', and FIG. 6 shows an example in a case in which a magnetic element is added to the tunnel barrier layer 3.

In the example shown in FIG. 5, the magnetization M1 of the first ferromagnetic layer 1 easily fluctuates in the vicinity of the interface F between the first ferromagnetic layer 1 and the tunnel barrier layer 3'. This is because the tunnel barrier layer 3' does not include a magnetic element and the magnetization M1 on the side of the interface F is not fixed and is open. As the temperature rises, the magnetization M1 fluctuates greatly, and magnon scattering Ms also occurs greatly. The fluctuation amount of the magnetization M1 greatly varies at a high-temperature state and a low-temperature state, and a magnitude of the magnon scattering Ms also largely fluctuates.

Also, in the example shown in FIG. 6, the magnetization M1 of the first ferromagnetic layer 1 easily fluctuates in the vicinity of the interface F between the first ferromagnetic layer 1 and the tunnel barrier layer 3. However, the tunnel barrier layer 3 has the magnetization $M_M$ in accordance with the magnetic element. Movement of the magnetization M1 on the side of the interface F is controlled by the magnetization $M_M$. That is, the magnetization M1 on the side of the interface F is more unlikely to fluctuate than in the case in which the tunnel barrier layer 3 does not include a magnetic element. In other words, in the same temperature range, a magnitude of the magnon scattering Ms which occurs is smaller than in the case in which the tunnel barrier layer 3 does not have a magnetic element. A difference in the fluctuation amount between a high-temperature state and a low-temperature state of the magnetization M1 is smaller than in the case in which the tunnel barrier layer 3 does not have the magnetic element, and thus a variation amount of the magnon scattering Ms also becomes small.

When the magnetic element is added to the tunnel barrier layer 3 in this way, the stability (stiffness) of the magnetization M1 of the first ferromagnetic layer 1 is enhanced. FIGS. 5 and 6 show the interface F between the first ferromagnetic layer 1 and the tunnel barrier layer 3 as an example, and the same can be applied to the interface between the second ferromagnetic layer 2 and the tunnel barrier layer 3.

The MR ratio of the magnetoresistance effect element 10 is obtained by $(R_{AP}-R_P)/R_P \times 100$. $R_{AP}$ is a resistance value in a laminating direction of the magnetoresistance effect element 10 in a magnetization anti-parallel state of the first ferromagnetic layer 1 and the second ferromagnetic layer 2, and $R_P$ is a resistance value in the laminating direction of the magnetoresistance effect element 10 in a magnetization parallel state of the first ferromagnetic layer 1 and the second ferromagnetic layer 2. When the magnetization fluctuates due to temperature variation, the resistance values $R_{AP}$ and $R_P$ decrease, and thus the MR ratio decreases. In other words, when the stability of the magnetization of the first ferromagnetic layer 1 and the second ferromagnetic layer is increased by the magnetic element, the temperature dependency of the MR ratio becomes small.

The magnetic element M added to the tunnel barrier layer 3 is an element which is contained in an alloy or an intermetallic compound and develops ferromagnetism or antiferromagnetism at room temperature. The magnetic element M is preferably one or more elements selected from the group consisting of Cr, Mn, Fe, Co, and Ni and is more preferably one or more elements selected from the group consisting of Fe, Co, and Ni.

Cr, Mn, Fe, Co, and Ni are 3d transition metal elements allowing ferromagnetism or antiferromagnetism to be exhibited in an alloy or an intermetallic compound. A 3d transition metal element readily dissolves in the tunnel barrier layer 3. In addition, Fe, Co and Ni are elements showing ferromagnetism in an alloy and an intermetallic compound. The fluctuation in the magnetization of the first ferromagnetic layer 1 and the second ferromagnetic layer 2 can be further minimized when the magnetization direction of the magnetic element is aligned in a predetermined direction.

It is preferable that the magnetic element M be present on the interface F sides between the tunnel barrier layer 3 and the first ferromagnetic layer 1 and the second ferromagnetic layer 2 than at a center of the tunnel barrier layer 3 in the laminating direction. The magnetization of the first ferromagnetic layer 1 and the second ferromagnetic layer 2 fluctuates particularly easily in the vicinity of the interface F between of the first ferromagnetic layer 1 and the second ferromagnetic layer 2 and the tunnel barrier layer 3. The fluctuation in the magnetization of the first ferromagnetic layer 1 and the second ferromagnetic layer 2 can be further suppressed by increasing a concentration of the magnetic element in the vicinity of the interface F between the first ferromagnetic layer 1 and the second ferromagnetic layer 2.

The magnetic element M is added to the tunnel barrier layer 3. This addition means that a small amount of a target element is included with respect to main components. A small amount of the magnetic element M is contained in the tunnel barrier layer 3 with respect to the element A, the element B and the oxygen forming the main component (main structure) of the tunnel barrier layer 3.

An abundance ratio of the magnetic element M to the total number of atoms of the element A and the element B in the tunnel barrier layer 3 is preferably 0.3% or more and 3% or less, more preferably 0.7% or more and 2.2% or less, and still more preferably 0.7% or more and 1.5% or less. That is, it is preferable that an elemental proportion of the magnetic element M in all the metal elements contained in the tunnel barrier layer 3 be within the above-described range.

When the tunnel barrier layer 3 is the substitutional solid solution, the tunnel barrier layer is represented by a composition formula $A_\alpha B_\beta M_x O_\gamma$. In the above-described composition formula, A is an element A, B is an element B, and M is a magnetic element, $\alpha+\beta+x=1$, $\beta \neq 0$, and $0.35 \leq \gamma \leq 1.7$. In this case, x in the composition formula preferably satisfies $0.003 \leq x \leq 0.029$, more preferably satisfies $0.007 \leq x \leq 0.022$, and still more preferably satisfies $0.007 \leq x \leq 0.015$. When an amount of the magnetic element contained in the tunnel barrier layer 3 is within the above-described range, it is possible to increase the magnetic stiffness of the first ferromagnetic layer 1 and the second ferromagnetic layer 2 while maintaining the MR ratio.

(Shape and Dimensions of Element)

A laminated body including the first ferromagnetic layer 1, the tunnel barrier layer 3 and the second ferromagnetic layer 2 constituting the magnetoresistance effect element 10 has a columnar shape. A shape of the laminated body in a plan view can take various shapes such as a circular shape, an elliptical shape, a quadrangular shape (a square shape or a rectangular shape), a triangular shape, a polygonal shape, or the like and can be selected according to applications. For example, when it is desired to impart shape magnetic anisotropy to the laminated body, it is preferable that the shape be an elliptical shape or a rectangular shape. On the other hand, when it is not desired to impart shape magnetic anisotropy to the laminated body, the shape is preferably a circular in view of symmetry, in other words, the laminated body preferably has a cylindrical shape.

When the laminated body has a cylindrical shape, a diameter thereof in a plan view is preferably 80 nm or less, more preferably 60 nm or less and still more preferably 30 nm or less. When the diameter is 80 nm or less, a domain structure is not likely to be formed in the ferromagnetic layer, and it is not necessary to consider a component different from spin polarization in the ferromagnetic layer. Further, when the diameter is 30 nm or less, a single domain structure is formed in the ferromagnetic layer, and a magnetization reversal speed and probability are improved. Further, there is a strong demand for lowering resistance in a miniaturized magnetoresistance effect element.

(Others)

The magnetoresistance effect element 10 may have any one of a top pin structure in which a magnetization fixed layer is located farther from a substrate than a magnetization free layer and a bottom pin structure in which the magnetization fixed layer is closer to the substrate than the magnetization free layer.

The magnetoresistance effect element using the embodiment can be used as a magnetic sensor or a memory such as an MRAM.

"Manufacturing method of magnetoresistance effect element"

Next, a method of manufacturing the magnetoresistance effect element will be described.

The method of manufacturing the magnetoresistance effect element according to the embodiment includes a process of laminating the first ferromagnetic layer, the tunnel barrier layer, and the second ferromagnetic layer. A well-known method such as a sputtering method, a vapor deposition method, a laser ablation method, a molecular beam epitaxial (MBE) method, or the like can be used as a film formation method of these layers.

A method for forming the tunnel barrier layer is divided into a process of forming a metal thin film, a process of naturally oxidizing the formed metal thin film by plasma oxidation or oxygen introduction, and a process of applying a heat treatment to the oxide film. The magnetic element is supplied at the same time when the metal thin film is formed. For example, when a metal thin film is formed by sputtering, the metal thin film to which a magnetic element is added is formed by preparing a target containing the magnetic element and performing the sputtering on the target containing the magnetic element at the same time as a metal target forming a main structure of the tunnel barrier layer. Further, a concentration of the magnetic element in a thickness direction can be adjusted by controlling a timing of performing the sputtering on the target containing the magnetic element.

Further, the method for forming the tunnel barrier layer is not limited to the above-described method. An additional element may be supplied to the tunnel barrier layer 3 due to thermal diffusion from an adjacent layer, for example, by adjusting heat treatment conditions and constituent elements of the adjacent layer.

As described above, in the magnetoresistance effect element 10 according to the embodiment, the magnetic element is added to the tunnel barrier layer 3. The tunnel barrier layer 3, which is a non-magnetic layer, serves to separate the magnetization of the first ferromagnetic layer 1 from the magnetization of the second ferromagnetic layer 2, and addition of the magnetic element M to the layer was avoided. On the other hand, according to the magnetoresistance effect element 10 of the embodiment, it was found that the magnetic stiffness of the first ferromagnetic layer 1 and the second ferromagnetic layer 2 was increased by adding the magnetic element M to the tunnel barrier layer 3, and thus the magnitude of the magnon scattering Ms and the temperature dependency at the interface could be reduced. That is, according to the magnetoresistance effect element 10 of the embodiment, it is possible to reduce the fluctuation in the MR ratio with respect to a temperature variation. Specifically, according to the magnetoresistance effect element 10 of the embodiment, a ratio of the MR ratio at a temperature of 400 K to the MR ratio at room temperature can be set to 0.9 or more.

Further, in the magnetoresistance effect element 10 according to the embodiment, since the main skeleton (the main structure) of the tunnel barrier layer 3 formed of A-B-O is maintained, a high MR ratio of 80% or more can be realized even at room temperature. Also, as described above, the MR ratio of the magnetoresistance effect element 10 can be prevented from being greatly lowered from room temperature.

EXAMPLES

Example 1

The magnetoresistance effect element 10 shown in FIG. 1 was prepared on a MgO (001) substrate. First, Cr was laminated as the underlayer (also, serving as a first wiring 15 to be described later) with a thickness of 40 nm, and Fe was laminated as the first ferromagnetic layer 1 with a thickness of 30 nm on the substrate.

Subsequently, a metal thin film containing Mg and Al was formed on the first ferromagnetic layer 1 by a sputtering method. At this time, a Fe element was supplied as the magnetic element to the metal thin film. A Mg—Al—O film (the tunnel barrier layer 3) to which Fe was added was formed with a thickness of 1.2 nm by oxidizing the obtained metal thin film. A content of the Fe element with respect to the total number of atoms of Mg and Al was 1 at %. The Fe element was the substitutional solid solution in which a part of an Al element in the Mg—Al—O film was substituted.

Next, on the tunnel barrier layer 3, Fe was laminated as the second ferromagnetic layer 2 with a thickness of 6 nm to obtain a ferromagnetic tunnel junction. Further, on the second ferromagnetic layer 2, IrMn was deposited as an antiferromagnetic layer with a thickness of 12 nm, and Ru was formed as a cap layer (also, serving as a second wiring 11 to be described later) with a thickness of 20 nm, and thus the magnetoresistance effect element 10 was obtained. Finally, the heat treatment was applied at a temperature of 175° C. while a magnetic field of 5 kOe was applied, and uniaxial magnetic anisotropy was imparted to the second ferromagnetic layer 2.

A Fe composition ratio contained in the tunnel barrier layer 3 was obtained by preparing a flake sample with a focused ion beam and performing energy-dispersive X-ray analysis (EDS) in a transmission electron microscope (TEM). Further, whether the Fe element is the substitutional solid solution or the interstitial solid solution was measured by X-ray diffraction (XRD), but it may be performed by the TEM or a scanning transmission electron microscope (STEM).

Since a thickness of the tunnel barrier layer 3 is thin, an appropriate analysis result may not be obtained even when the tunnel barrier layer 3 itself is measured by the EDS and the XRD. Therefore, the Mg—Al—O layer to which Fe was added was laminated a plurality of times to ensure a sufficient film thickness necessary for the composition ratio measurement, and then the Fe composition ratio and the Fe addition state were obtained. Here, the Fe composition ratio is defined as an atomic composition percentage (at %) with respect to Mg atoms and Al atoms and is represented by 100× "the number of Fe atoms"/("the number of Mg atoms"+"the number of Al atoms"). However, the analysis method is not limited thereto and may also be carried out using secondary ion mass spectrometry (SIMS), an atom probe method, or electron energy loss spectroscopy (EELS).

The MR ratio of the manufactured magnetoresistance effect element 10 was measured. The MR ratio was measured under two temperature conditions of 300 K (room temperature) and 400 K. The MR ratio of the magnetoresistance effect element 10 of Example 1 at room temperature was 80% or more.

Figure 7:
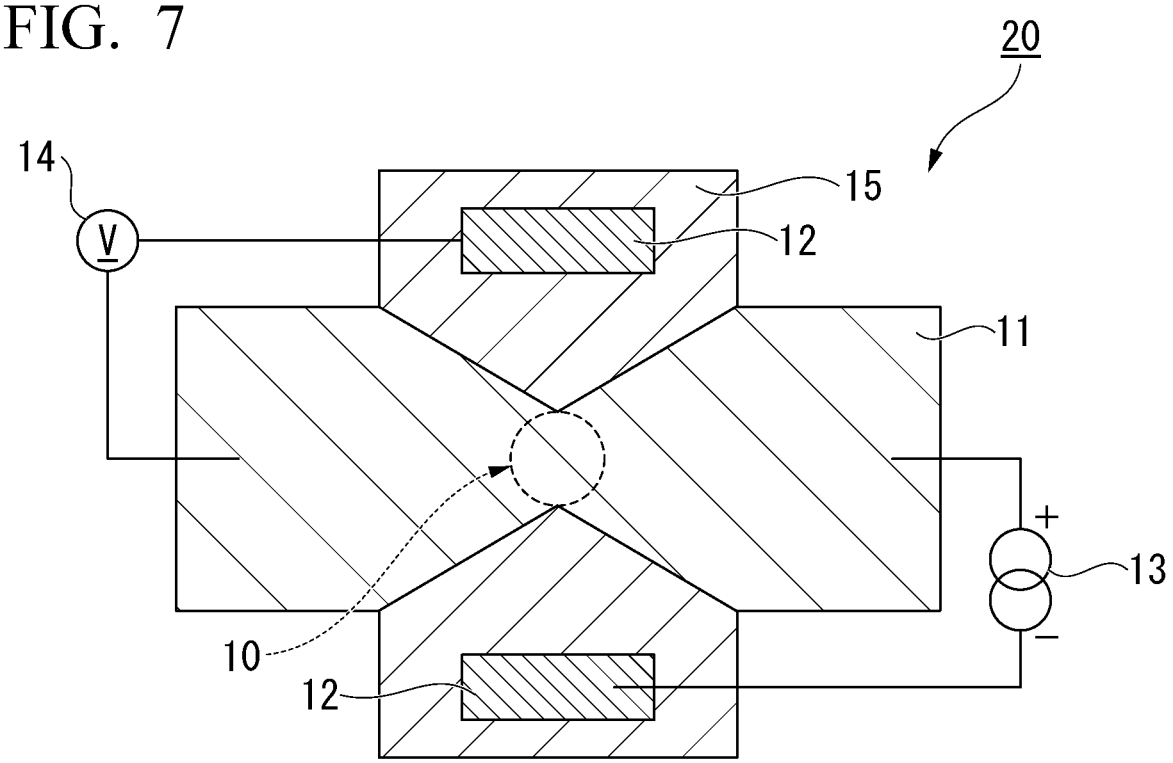
FIG. 7 is a schematic diagram in a plan view of a magnetoresistance effect device used for measuring an MR ratio in a laminating direction.

FIG. 7 is a schematic diagram in a plan view of a magnetoresistance effect device 20 used for measuring the MR ratio in a laminating direction. The magnetoresistance effect element 10 is provided at a position in which the first wiring 15 and the second wiring 11 intersect. The magnetoresistance effect element 10 was formed in a cylindrical shape having a diameter of 80 nm. Additionally, an electrode 12 was provided on the first wiring 15, and the electrode 12 was connected to a power supply 13 and a voltmeter 14. When a voltage was applied by the power supply 13, a current flowed in the laminating direction of the magnetoresistance effect element 10. A potential difference of the magnetoresistance effect element 10 at this time was monitored by the voltmeter 14. Additionally, a resistance change of the magnetoresistance effect element was observed by applying a current or a voltage to the magnetoresistance effect element while sweeping a magnetic field from an outside to the magnetoresistance effect element 10.

Example 2 to Example 7

Magnetoresistance effect elements according to Examples 2 to 7 are different from that of Example 1 in that the magnetic element which was added to the tunnel barrier layer was changed. Other conditions were the same as in Example 1. Co was used as the magnetic element in Example 2, Ni was used as the magnetic element in Example 3, Cr was used as the magnetic element in Example 4, Mn was used as the magnetic element in Example 5, Gd was used as the magnetic element in Example 6, and Tb was used as the magnetic element in Example 7.

In the magnetoresistance effect elements according to Examples 2 to 7, as in the magnetoresistance effect element according to Example 1, the MR ratio of each of the magnetoresistance effect elements was measured under the two temperature conditions of 300 K (room temperature) and 400 K. The MR ratio of each of the magnetoresistance effect elements of Examples 2 to 5 at room temperature was 80% or more. On the other hand, the MR ratio of each of the magnetoresistance effect elements according to Example 6 using Gd as the magnetic element and Example 7 using Tb as the magnetic element at room temperature was less than 80%. It is considered that this is because Gd and Tb are magnetic metal elements of 4d and hard to be dissolved into the tunnel barrier layer.

Example 8 to Example 13

Magnetoresistance effect elements according to Examples 8 to 13 are different from that of Example 2 in that the addition amount of the magnetic element added to the tunnel barrier layer was changed. Other conditions were the same as in Example 2. The magnetoresistance effect elements according to Examples 8 to 13 include Co as the magnetic element. A content of the Co element with respect to the total number of atoms of Mg and Al was 0.3 at % in Example 8, the content of the Co element with respect to the total number of atoms of Mg and Al was 0.7 at % in Example 9, the content of the Co element with respect to the total number of atoms of Mg and Al was 1.5 at % in Example 10, the content of the Co element with respect to the total number of atoms of Mg and Al was 2.2 at % in Example 11, the content of the Co element with respect to the total number of atoms of Mg and Al was 3.0 at % in Example 12, and the content of the Co element with respect to the total number of atoms of Mg and Al was 3.6 at % in Example 13.

In the magnetoresistance effect elements according to Examples 8 to 13, as in the magnetoresistance effect element according to Example 1, the MR ratio of each of the magnetoresistance effect elements was measured under the two temperature conditions of 300 K (room temperature) and 400 K.

Example 14

A magnetoresistance effect element according to Example 14 is different from Example 1 in that the magnetic element added to the tunnel barrier layer was changed to Nd. Other conditions were the same as in Example 1. As a result of XRD diffraction, it was found that the tunnel barrier layer was constituted with the interstitial solid solution.

Example 15

A magnetoresistance effect element according to Example 15 is different from Example 1 in that a Mg—In—O film to which Co was added was used as the tunnel barrier layer. The content of the Co element with respect to the total number of atoms of Mg and Al was 1.6 at %. Other conditions were the same as in Example 1. As a result of the XRD diffraction, it was found that the tunnel barrier layer was constituted with the substitutional solid solution.

Comparative Example 1

A magnetoresistance effect element according to Comparative Example 1 is different from Example 1 in that the magnetic element was not added to the tunnel barrier layer. Other conditions were the same as in Example 1.

The contents of the magnetic elements, the temperature dependency of the MR ratio, and the like in Examples 1 to 14 and Comparative Example 1 are summarized in the following Table 1. In Table 1, x is a value of x when the composition formula is represented by $A_\alpha B_\beta M_x O_\gamma$.

TABLE 1

| | Additional element | Composition ratio of additional element (at %) | x | MR ratio (400K)/ MR ratio (300K) (%) | Main composition of tunnel barrier layer |
|---|---|---|---|---|---|
| Example 1 | Fe | 1.0 | 0.01 | 0.935 | Mg—Al—O (Substitutional type) |
| Example 2 | Co | 1.0 | 0.01 | 0.927 | Mg—Al—O (Substitutional type) |
| Example 3 | Ni | 1.0 | 0.01 | 0.921 | Mg—Al—O (Substitutional type) |
| Example 4 | Cr | 1.0 | 0.01 | 0.903 | Mg—Al—O (Substitutional type) |
| Example 5 | Mn | 1.0 | 0.01 | 0.909 | Mg—Al—O (Substitutional type) |
| Example 6 | Gd | 1.0 | 0.01 | 0.914 | Mg—Al—O (Substitutional type) |
| Example 7 | Tb | 1.0 | 0.01 | 0.912 | Mg—Al—O (Substitutional type) |
| Example 8 | Co | 0.3 | 0.003 | 0.925 | Mg—Al—O (Substitutional type) |
| Example 9 | Co | 0.7 | 0.007 | 0.932 | Mg—Al—O (Substitutional type) |
| Example 10 | Co | 1.5 | 0.015 | 0.934 | Mg—Al—O (Substitutional type) |
| Example 11 | Co | 2.2 | 0.022 | 0.927 | Mg—Al—O (Substitutional type) |
| Example 12 | Co | 3.0 | 0.029 | 0.912 | Mg—Al—O (Substitutional type) |
| Example 13 | Co | 3.6 | 0.035 | 0.899 | Mg—Al—O (Substitutional type) |
| Example 14 | Nd | 1.5 | 0.015 | 0.911 | Mg—Al—O (Interstitial type) |

TABLE 1-continued

| | Additional element | Composition ratio of additional element (at %) | x | MR ratio (400K)/ MR ratio (300K) (%) | Main composition of tunnel barrier layer |
|---|---|---|---|---|---|
| Example 15 | Co | 1.6 | 0.016 | 0.931 | Mg—Al—O (Substitutional type) |
| Comparative example 1 | — | — | — | 0.893 | Mg—Al—O |

As shown in Table 1, values obtained by dividing the MR ratio at 400 K by the MR ratio at 300 K (MR ratio (400 K)/MR ratio (300 K)) were greater in Examples 1 to 14 than in Comparative Example 1. That is, in Examples 1 to 14, the fluctuation amount of the MR ratio according to the temperature variation was smaller than that in Comparative Example 1.

According to the present invention, it is possible to provide a magnetoresistance effect element with little fluctuation in an MR ratio in accordance with temperature variation.

EXPLANATION OF REFERENCES

1 First ferromagnetic layer
2 Second ferromagnetic layer
3, 3' Tunnel barrier layer
10 Magnetoresistance effect element
11 Second wiring
12 Electrode
13 Power supply
14 Voltmeter
15 First wiring
20 Magnetoresistance effect device
M1, Mz Magnetization
Ms Magnon scattering
F Interface

What is claimed is:

1. A magnetoresistance effect element, comprising:
a first ferromagnetic layer;
a second ferromagnetic layer; and
a tunnel barrier layer sandwiched between the first ferromagnetic layer and the second ferromagnetic layer,
wherein the tunnel barrier layer is an oxide having a spinel structure, and the tunnel barrier layer includes a magnetic element as an additional element,
at least some of the magnetic element intrudes between crystal lattices of the spinel structure,
the magnetic element is element that is different from the main components of the spinel structure, and
the magnetic element exhibits ferromagnetism or antiferromagnetism in an alloy or an intermetallic compound.

2. The magnetoresistance effect element according to claim 1, wherein the magnetic element is one or more elements selected from a group consisting of Cr, Mn, Fe, Co, and Ni.

3. The magnetoresistance effect element according to claim 1, wherein the magnetic element is one or more elements selected from a group consisting of Fe, Co, and Ni.

4. The magnetoresistance effect element according to claim 1, wherein more of the magnetic element is present on interface sides between the tunnel barrier layer and the first ferromagnetic layer and the second ferromagnetic layer than at a center of the tunnel barrier layer in a laminating direction.

5. The magnetoresistance effect element according to claim 1, wherein the tunnel barrier layer having the spinel structure includes an element A and an element B,
the element A is one or more elements selected from a group consisting of Mg and Zn, and
the element B is one or more elements selected from a group consisting of Al, In, and Ga.

6. The magnetoresistance effect element according to claim 5, wherein the tunnel barrier layer is represented by a composition formula $A_\alpha B_\beta M_x O_y$, and in the composition formula, A is the element A, B is the element B, M is a magnetic element, and $\alpha+\beta+x=1$, $\beta \neq 0$, $0.35 \leq y \leq 1.7$, $0.003 \leq x \leq 0.029$.

7. The magnetoresistance effect element according to claim 1, wherein an MR ratio at room temperature is 80% or more, and
the MR ratio is obtained by following formula (1)

$$(R_{AP}-R_P)/R_P \times 100 \qquad (1)$$

where $R_{AP}$ is a resistance value in a laminating direction of the magnetoresistance effect element in a magnetization anti-parallel state of the first ferromagnetic layer and the second ferromagnetic layer, and $R_P$ is a resistance value in the laminating direction of the magnetoresistance effect element in a magnetization parallel state of the first ferromagnetic layer and the second ferromagnetic layer.

8. The magnetoresistance effect element according to claim 1, wherein a ratio of the MR ratio at a temperature of 400 K to the MR ratio at room temperature is 0.9 or more, and
the MR ratio is obtained by following formula (1)

$$(R_{AP}-R_P)/R_P \times 100 \qquad (1)$$

where $R_{AP}$ is a resistance value in a laminating direction of the magnetoresistance effect element in a magnetization anti-parallel state of the first ferromagnetic layer and the second ferromagnetic layer, and $R_P$ is a resistance value in the laminating direction of the magnetoresistance effect element in a magnetization parallel state of the first ferromagnetic layer and the second ferromagnetic layer.

9. The magnetoresistance effect element according to claim 1, wherein the tunnel barrier layer having the spinel structure includes an element A and an element B, and
an abundance ratio of the magnetic element with respect to the total number of atoms of the element A and the element B in the tunnel barrier layer is 0.3 at % or more and 3 at % or less.

10. The magnetoresistance effect element according to claim 1, wherein the tunnel barrier layer having the spinel structure includes an element A and an element B that form the crystal lattices of the spinel structure, and
at least some of the magnetic element is disposed between the element A and the element B in the spinel structure.

11. A magnetoresistance effect element, comprising:
a first ferromagnetic layer;
a second ferromagnetic layer; and
a tunnel barrier layer sandwiched between the first ferromagnetic layer and the second ferromagnetic layer,
wherein the tunnel barrier layer is an oxide having a spinel structure, and the tunnel barrier layer includes a magnetic element as an additional element, and
the magnetic element is one or more elements selected from the group consisting of Gd, Tb and Nd.

* * * * *